US008120963B2

(12) United States Patent
Surico et al.

(10) Patent No.: US 8,120,963 B2
(45) Date of Patent: Feb. 21, 2012

(54) METHOD AND SYSTEM FOR PROGRAM PULSE GENERATION DURING PROGRAMMING OF NONVOLATILE ELECTRONIC DEVICES (75) Inventors: Stefano Surico, Milan (IT); Mirella Marsella, Taranto (IT); Monica Marziani, Milan (IT); Mauro Chinosi, Burago Di Molgora (IT)

(73) Assignee: Atmel Corporation, San Jose, CA (US)

( * ) Notice: Subject to any disclaimer, the term of this patent is extended or adjusted under 35 U.S.C. 154(b) by 74 days.

(21) Appl. No.: 12/535,455

(22) Filed: Aug. 4, 2009

(65) Prior Publication Data
US 2009/0290424 A1    Nov. 26, 2009

Related U.S. Application Data

(63) Continuation of application No. 11/230,358, filed on Sep. 19, 2005, now Pat. No. 7,570,519.

(30) Foreign Application Priority Data

May 3, 2005 (IT) .............................. MI2005A0798

(51) Int. Cl.
*G11C 11/34* (2006.01)
(52) U.S. Cl. ................................................. 365/185.19
(58) Field of Classification Search .............. 365/185.19
See application file for complete search history.

(56) References Cited

U.S. PATENT DOCUMENTS 5,969,986 A * 10/1999 Wong et al. .............. 365/185.03
5,991,200 A   11/1999 Seki et al.
6,011,715 A    1/2000 Pasotti et al.
6,094,368 A *  7/2000 Ching ........................ 365/49.15
6,101,121 A    8/2000 Rolandi
6,522,580 B2   2/2003 Chen et al.
6,542,404 B2   4/2003 Pierin et al.
6,667,904 B2  12/2003 Takeuchi et al.
6,751,118 B2   6/2004 Tran et al.
6,768,676 B2   7/2004 Hirano
6,784,658 B2   8/2004 Kawagoe et al.
7,570,519 B2   8/2009 Surico et al.

(Continued)

FOREIGN PATENT DOCUMENTS
WO    WO-2006/119327 A2    11/2006

OTHER PUBLICATIONS

"U.S. Appl. No. 11/230,358, Advisory Action mailed Jan. 13, 2009", 3 pgs.

(Continued)

*Primary Examiner* — Hoai V Ho
*Assistant Examiner* — Anthan Tran
(74) *Attorney, Agent, or Firm* — Fish & Richardson P.C.

(57) ABSTRACT

Aspects for program pulse generation during programming of nonvolatile electronic devices include providing a configurable voltage sequence generator to manage verify-pulse and pulse-verify switching as needed during modification operations of a programming algorithm for nonvolatile electronic devices, wherein more efficient modification operations result. In this manner, highly flexible bit sequence generation that can be easily managed by a microcontroller occurs, resulting in a shorter code length, a faster execution time, and ease of reuse in different devices. More particularly, fully compatible voltage sequence generation is introduced that can be applied on the terminals of the flash cells being modified and permits an efficient and time saving management of pulse-verify and verify-pulse switching.

7 Claims, 8 Drawing Sheets

U.S. PATENT DOCUMENTS

| | | |
|---|---|---|
| 2002/0048193 A1 | 4/2002 | Tanikawa et al. |
| 2004/0052136 A1 | 3/2004 | Hazama |
| 2004/0052137 A1 | 3/2004 | Hazama |
| 2004/0080979 A1 | 4/2004 | Park |
| 2006/0039207 A1 | 2/2006 | Combe et al. |
| 2006/0250851 A1 | 11/2006 | Surico et al. |

OTHER PUBLICATIONS

"U.S. Appl. No. 11/230,358, Amendment and Response filed Nov. 17, 2008 to Final Office Action mailed Sep. 15, 2008", 9 pgs.

"U.S. Appl. No. 11/230,358, Final Office Action mailed Sep. 15, 2008", 11 pgs.

"U.S. Appl. No. 11/230,358, Notice of Allowance mailed on Mar. 31, 2009", 8 pgs.

"U.S. Appl. No. 11/230,358, Response filed Jun. 11, 2008 to Non Final Office Action mailed Mar. 8, 2011", 10 pgs.

"International Application Serial No. PCT/US2006/016902, International Search Report mailed 1010-16-2007", 2 pgs.

"International Application Serial No. PCT/US2006/016902, Written Opinion mailed Oct. 16, 2007", 5 pgs.

"U.S. Appl. No. 11/230,358, Non Final Office Action mailed Mar. 11, 2008", 8 pgs.

* cited by examiner

METHOD AND SYSTEM FOR PROGRAM PULSE GENERATION DURING PROGRAMMING OF NONVOLATILE ELECTRONIC DEVICES

CROSS-REFERENCE TO RELATED APPLICATIONS

This application is a Continuation of U.S. patent application Ser. No. 11/230,358, filed on Sep. 19, 2005, now U.S. Pat. No. 7,570,519 which claims benefit under 35 USC 119 of Italian Application no. MI2005A000798, filed May 3, 2005.

FIELD OF THE INVENTION

The present invention relates to program pulse generation during programming of nonvolatile electronic devices.

BACKGROUND OF THE INVENTION

Figure 1:
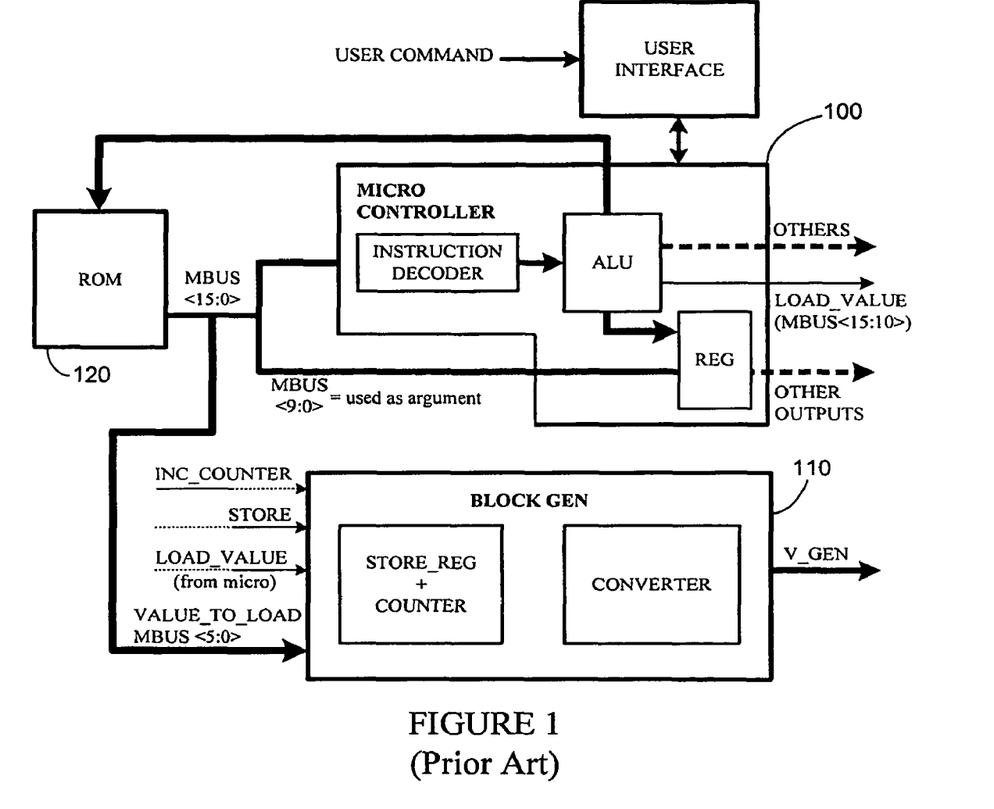
FIG. 1 illustrates a block diagram of a prior art system for programming.

In a nonvolatile electronic device of a flash memory, modify operations (word or buffered programming, sector or bank erasing) are managed by a microcontroller. Referring to Figure microcontroller 100 drives several different blocks, including voltage generator (BLOCK GEN) 110, pumps, regulators, address and time counters, switches, etc., by executing instructions of an algorithm written in a program storage device 120, e.g., an embedded ROM (or SRAM), and setting opportune outputs, as is well understood in the art. The number of operations to execute is increased in a significant way in multilevel flash memories where each flash cell can assume more than two different physical states. Of course, not only a correct functionality of modify operations is required but also a low area cost of circuitry used and strong timing performances.

In multilevel memory, operations are very different depending upon the kind of modify made along with the amount of parallelism used. In previous devices, the different options used were fully managed by the microcontroller that executed different branches of the algorithm according to the operation made and the characteristic of such operation. The algorithm had to manage the appropriate increment to use, had to load start program values, had to control the slope of the modify, including those cases with changes at certain voltages, and the microcontroller also had to stop increments once the maximum voltage had been reached. As a result, the code becomes very long, taking up much memory space, without enough flexibility and ability to reuse it in different structures.

In addition to these difficulties, management is required for switching between modify pulses and verify voltages. In fact, many flash memory modify operations are characterized by the sequence: modify pulse (to modify the state of selected cells); verify cell condition (logic value associated); and modify pulse at a higher voltage (in the event of a verify fail). This sequence is repeated until the verify succeeds or a maximum number of attempts has been reached (i.e., a case of failed operation).

Figure 10A:
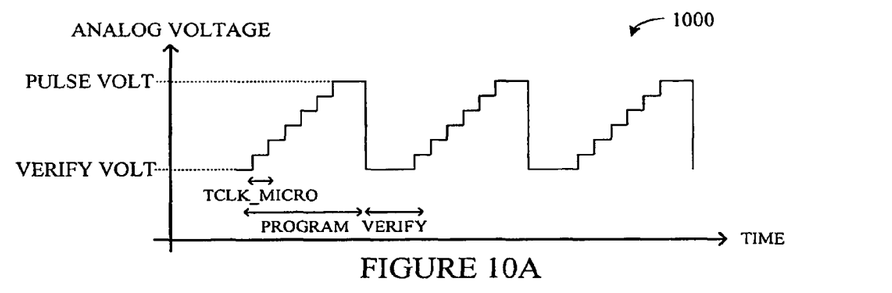
FIGS. 10a and 10b illustrate possible program sequences used for single level memories.
Figure 10B:
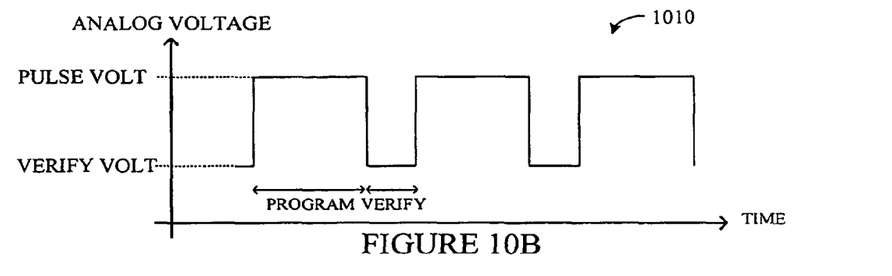

In single level memory programming, for instance, the pulse can be obtained by applying a ramp from 2V to 9V (volts) with a fixed slope (e.g., 1.5V/usec (microsecond)) on flash cell gates. After the program pulse, a verify occurs by a comparison of current between a cell that has to be programmed and a precisely set reference with a voltage at its gate equal to the gate voltage of the selected cell (Vverify). Programming usually ends after one or two pulse-verify sequences. Consecutive pulse conditions are the same, i.e., each program pulse has exactly the same characteristics of other pulses. In this case, the algorithm alternatively sets values used for the programming pulse and the values used for the verify conditions. So when a verify fails, the algorithm loads into BLOCK GEN 110 the next digital pulse value that is always the same, and it is not important if the pulse is the first, the second, or the tenth pulse. The program pulse value is not dependent upon the pulse number, and this is easy to manage by the algorithm. Possible sequences 1000, 1010 used in single level memories are shown in FIGS. 10a and 10b.

A completely different situation occurs in multilevel flash memory algorithms. In the case of program, for instance, each pulse has different conditions in order to have perfect control of the cells to be programmed. Usually, at each program pulse, following a verify operation, the gate voltage of the selected cells is 125 mV (millivolts) (SINGLE STEP) or 250 mV (DOUBLE STEP) higher than the previous pulse. So, when a verify occurs and the result is not successful, the circuitry or algorithm has to set the new pulse voltage in a way that depends on the previous attempt. This means that the pulse condition depends on the pulse number. It is possible to set a fixed voltage value which determines a slope change. Possible ramps for multilevel flash memory are shown in FIGS. 11a, 11b, 11c, and 11d.

Figure 11A:
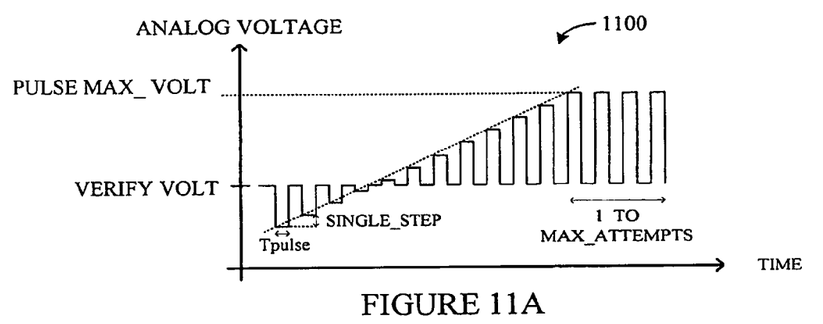
FIGS. 11a, 11b, 11c, and 11d illustrate possible ramp program sequences used for multilevel flash memory.
Figure 11B:
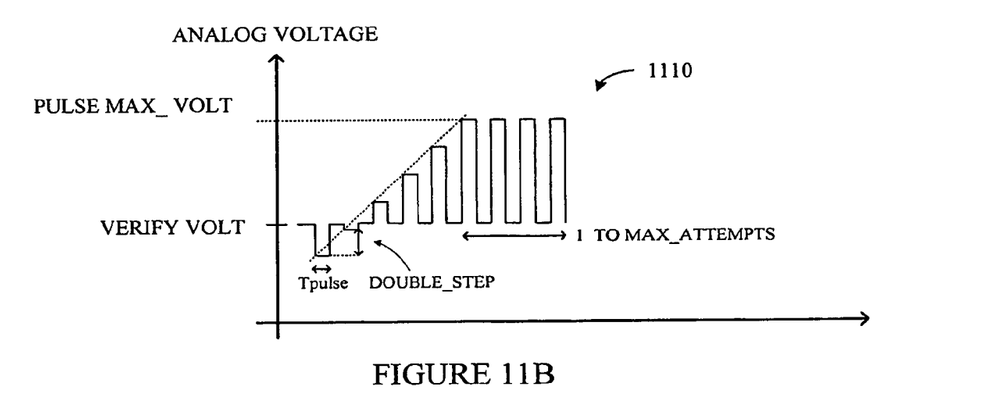
Figure 11C:
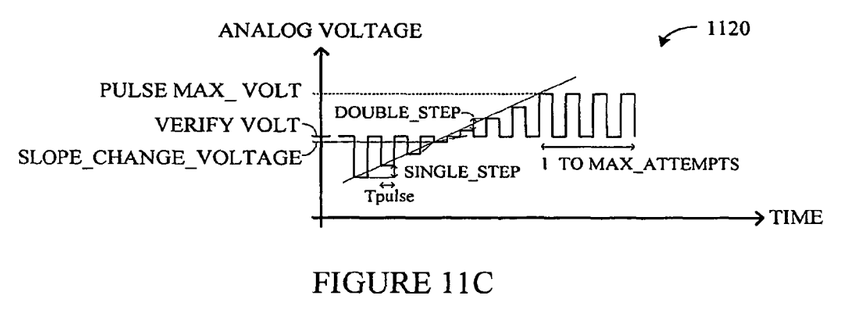
Figure 11D:
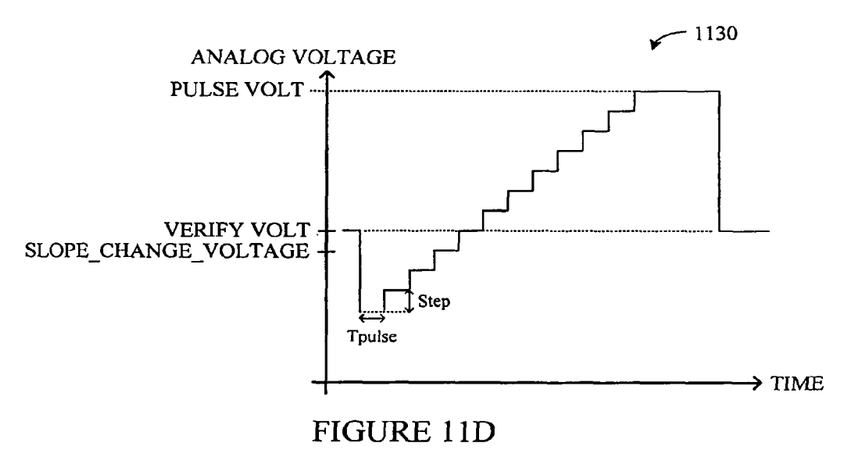

In FIG. 11a, a ramp 1100 is shown with a single step increment between pulses. FIG. 11b shows a ramp 1110 with a double step between pulses. A ramp 1120, with a slope change when a fixed voltage (CHANGE_RAMP_VOLT) is reached, is shown in FIG. 11c. In FIG. 11d, a blind ramp 1130 is shown, where a blind ramp refers to a ramp where no verify occurs between pulses and which is often used during test mode operations in multilevel devices. For FIGS. 11a, 11b, and 11c, these ramp illustrate situations with a pulse duration of Tpulse (where the time is counted in a flash counter) and intermediate verifies.

A typical approach used for an algorithm for prior art structures to obtain a ramp of pulses with intermediate values (e.g., the ramp of FIG. 11c) includes:
1. Load the first pulse digital value into a counter.
2. Provide a programming pulse.
3. Store the current pulse value in a register.
4. Load the verify configuration bits into the counter.
5. Execute a verify sequence.
6. Reload the last pulse digital value (if previous verify is not ok) from the register.
7. Determine if the maximum permitted voltage has been reached.
8. Determine if the voltage of slope changing has been reached.
9. Give none, one, or more increment(s) to set the next pulse digital value.
10. Provide a new programming pulse.

Steps 3 through 10 have to be executed in a loop until the verify operation is okay or the maximum number of attempts has been reached, in which case the operation fails.

A need exists for an approach that minimizes the control needed by the microcontroller while permitting faster management of pulse/verify and verify/pulse sequences during programming of flash memory cells. The present invention addresses such a need.

BRIEF SUMMARY OF THE INVENTION

Aspects for program pulse generation during programming of nonvolatile electronic devices include providing a configurable voltage sequence generator to manage verify-pulse and pulse-verify switching as needed during modification operations of a programming algorithm for nonvolatile electronic devices, wherein more efficient modification operations result.

Through the present invention, highly flexible bit sequence generation that can be easily managed by the microcontroller occurs. Advantages of the present invention include a shorter code length, a faster execution time, and ease of reuse in different devices. More particularly, the present invention introduces fully compatible voltage sequence generation that can be applied on the terminals of the flash cells being modified and permits an efficient and time saving management of pulse-verify and verify-pulse switching. These and other advantages of the aspects of the present invention will be more fully understood in conjunction with the following detailed description and accompanying drawings.

DETAILED DESCRIPTION OF THE INVENTION

The present invention relates to program pulse generation during programming of nonvolatile electronic devices. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiments shown but is to be accorded the widest scope consistent with the principles and features described herein.

In accordance with the present invention, an interface is provided that permits highly flexible bit sequence generation that can be easily managed by the microcontroller. Advantages of the present invention include a shorter code length, a faster execution time, and an ability for ease of reuse in different devices. More particularly, the interface introduces fully compatible voltage sequence generation that can be applied on the terminals of the flash cells being modified and permits an efficient and time saving management of pulse-verify and verify-pulse switching.

Figure 2:
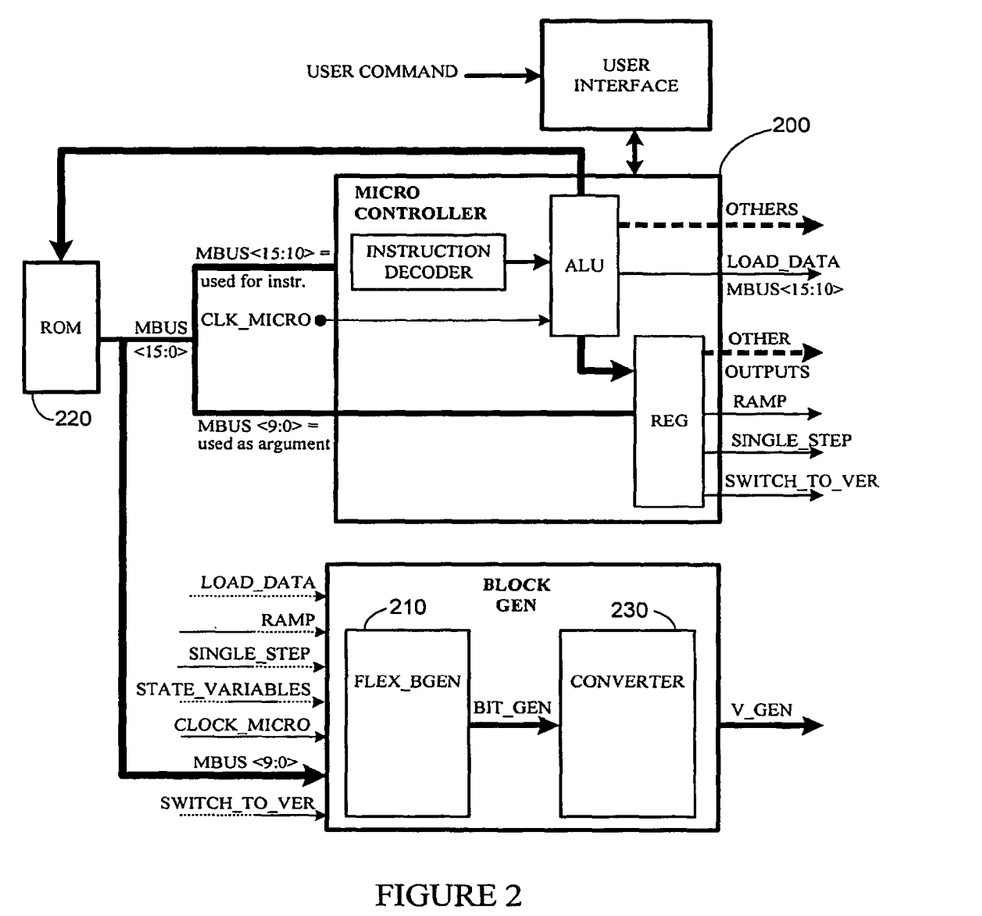
FIG. 2 illustrates a block diagram of a system for programming in accordance with the present invention.

FIG. 2 illustrates a block diagram of a system in accordance with the present invention that includes a flexible bit sequence generator, FLEX_BGEN. A microcontroller 200 manages FLEX_BGEN 210 according to an algorithm in storage device 220 (e.g. ROM), and the configuration of FLEX_BGEN 210 depends on state variables (program, erase, test mode, multilevel, etc.). Digital outputs of FLEX_BGEN 210, indicated in FIG. 2 as BIT_GEN, drive an analog circuit (a converter) 230 that provides a multivalue voltage depending on the BIT_GEN signals.

Figure 3:
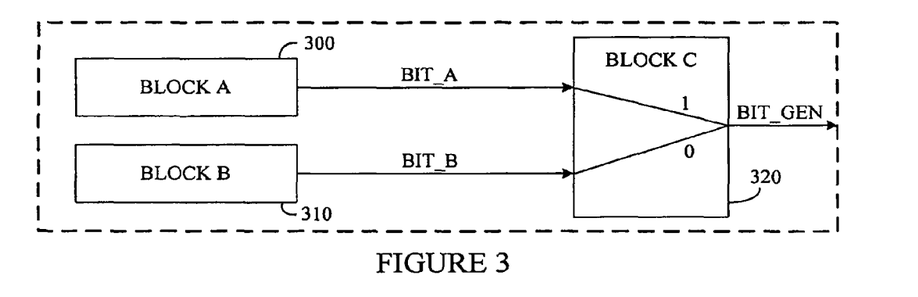
FIG. 3 illustrates a block diagram of a configurable voltage sequence generator of FIG. 2.

FIG. 3 illustrates a block diagram of FLEX_BGEN 210 in accordance with the present invention. BLOCK A 300 provides the circuitry for configurable voltage sequence generation. BLOCK B 310 provides all verify voltages depending upon the current operation. BLOCK C 320 is a switch that is controlled by the signal switch_to_ver from the microcontroller 200 (FIG. 2).

Figure 4:
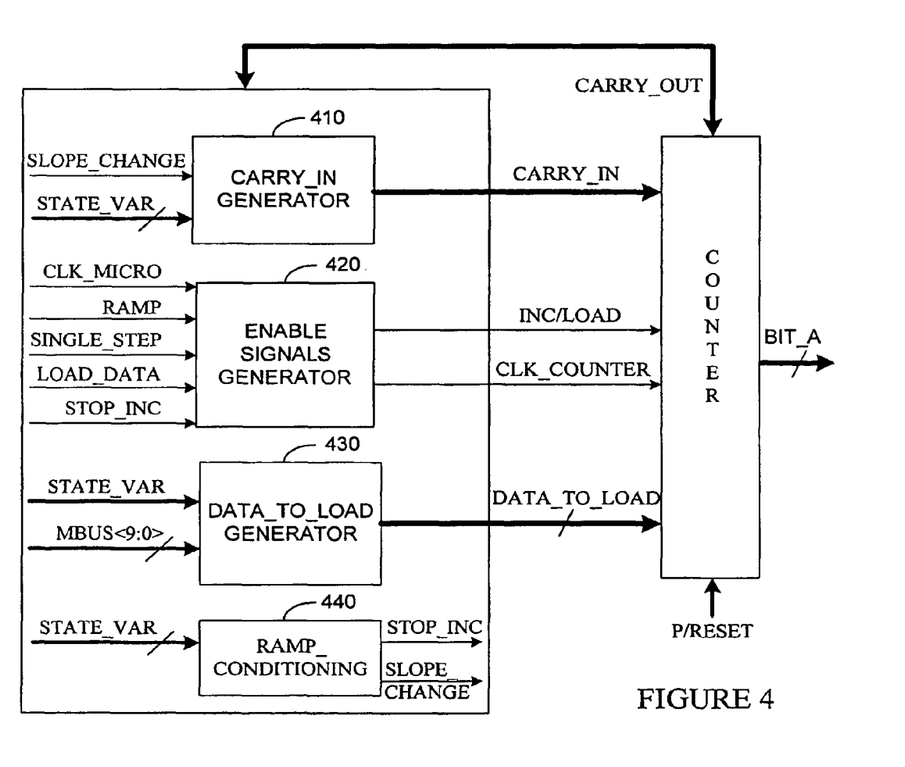
FIG. 4 illustrates a block diagram of circuitry of the configurable voltage sequence generator (BLOCK A of FIG. 3).

FIG. 4 illustrates a block diagram of details of BLOCK A 300. Included in BLOCK A 300 is an up/down counter 400. Also included are a carry_in generator 410, an enable signals generator 420, a data_to_load generator 430, and ramp_conditioning 440. The counter 400 can be loaded with a starting value (data_to_load) when control signal inc/load is found low on rising edge of clk_counter. Otherwise, if on rising edge of clk_counter, the signal inc/load is high, bit_a is incremented. In this case, the increment depends on "carry_in" inputs coming from carry_in generator 410.

Figure 5:
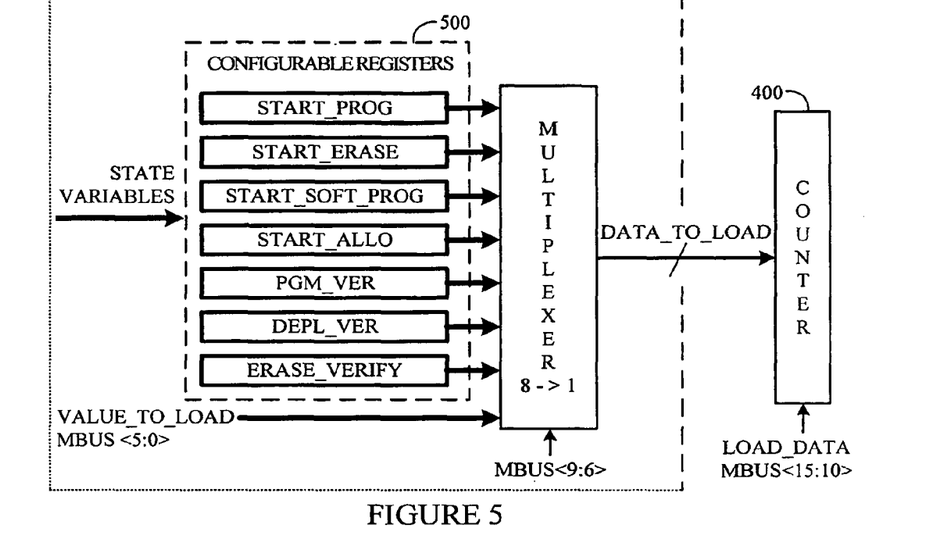
FIG. 5 illustrates a block diagram of circuitry of a data-to-load generator of FIG. 4.

The starting point of a ramp is obtained with a load operation (inc/load low on rising edge of clk_counter) which sets data_to_load as an initial value of the counter 400. The generation of data_to_load bus occurs by data_to_load generator 430, the details of which are illustrated by the block diagram shown in FIG. 5. Configurable registers 500 are configured based on state variables (from microcontroller 200) and demonstrate how a set of possible values can be loaded by a proper microinstruction (load_data). These values depend on appropriate state variables. The middle bits of the load_data instruction (MBUS<3:6>) decide which of these values must be assigned to data_to_load. The lower bits of the same instruction (<5:00>) can be alternatively used to assign a direct value to data_to_load. The higher bits (MBUS<15:10>) represent the OPCODE of the load_data instruction.

Figure 6:
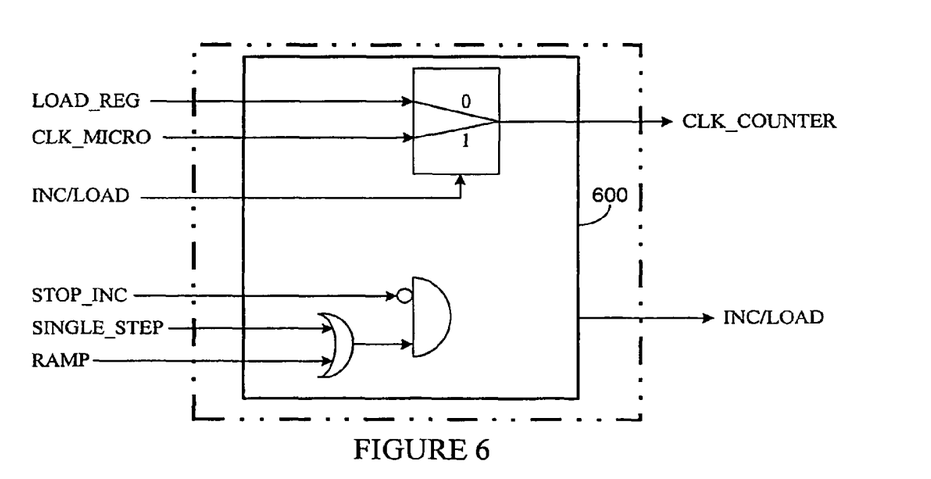
FIG. 6 illustrates a block diagram of circuitry of an enable signals generator of FIG. 4.
Figure 7:
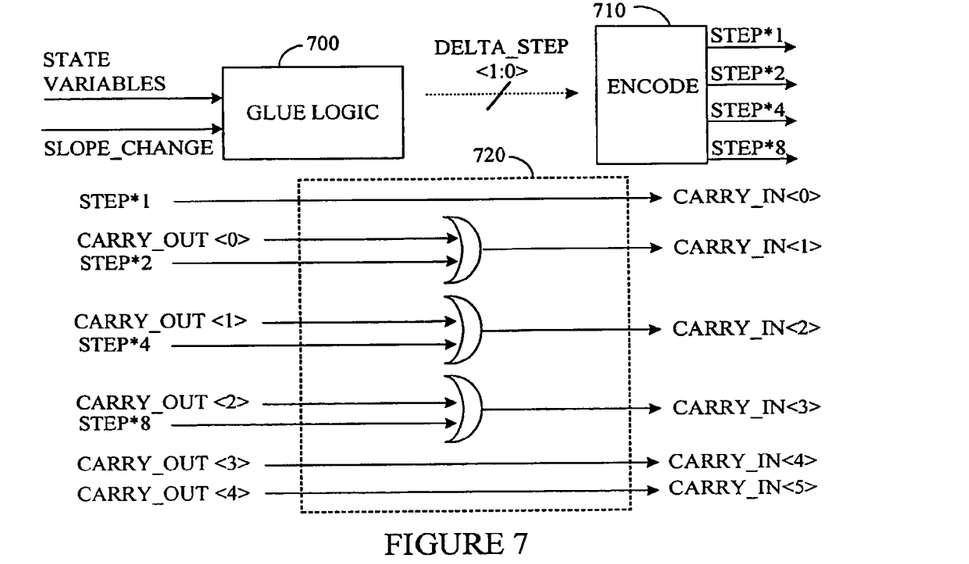
FIG. 7 illustrates a block diagram of circuitry of a carry-in generator of FIG. 4.

Once the up/down counter 400 has been loaded with the desired starting value, it is possible to generate a desired increasing sequence. The ramp generated will have a slope depending on how clk_counter and carry_in are generated. FIG. 6 and FIG. 7 show how these signals can be generated by enable signals generator 420 and carry_in generator 410.

Referring to FIG. 6, signals from microcontroller 200, single_step or ramp, are input to logic circuit 600 forming the enable signals generator 420 to signal whether only one counting step or a continuous counting (one increment at each microclock transition) is needed. The signals clk_counter and inc/load are produced from the logic circuit 600 such that if the signal set by microcontroller 200 is ramp, there will be an increment at each clk_micro falling edge. If the microcontroller 200 sets single_step, only one clk_counter active edge will be provided. Each increment (step) of the counter in both cases will depend on delta_step bits that are configured by glue_logic 700 of carry_in generator 410 shown in FIG. 7. The delta_step signal from glue_logic 700 depends on the state variables and slope_change signal from ramp_conditioning block 440 and is input to encode logic 710 that produces appropriate step signal values as is well understood in the art. In an algorithm (for instance in multilevel programming), a slope change of the ramp can be obtained at a desired voltage. In this case, the signal slope_change will be set and glue_logic 700 will consequently change delta_step. Delta_step and carry_out from up/counter 400 are used to generate carry_in by logic 720 of the carry_in generator 410.

Figure 8:
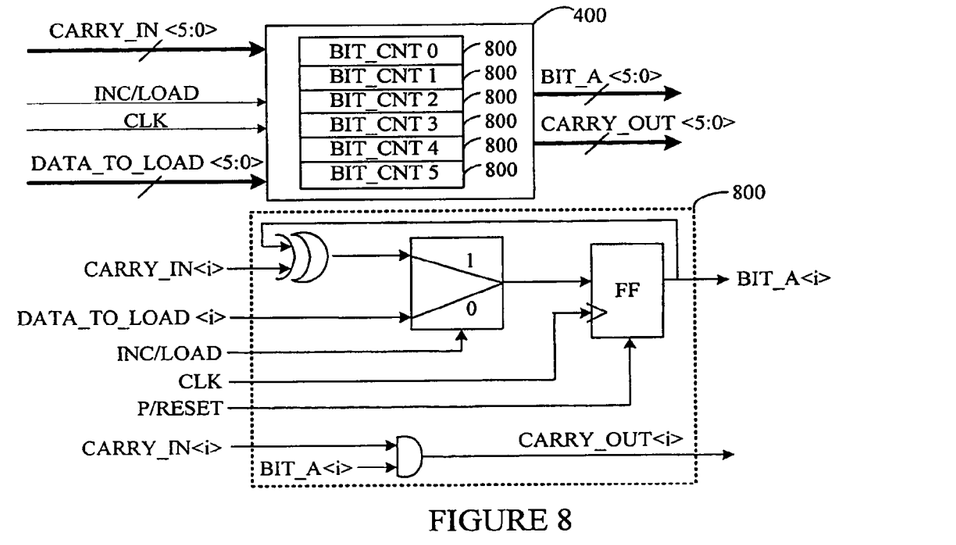
FIG. 8 illustrates a block diagram of circuitry of a counter of FIG. 4.

FIG. 8 shows how the generated carry_in acts on counting in the counter 400. Logic circuitry of each single bit counter 800 of the counter 400 is shown that produce the bit_A and carry_out signals.

Figure 9:
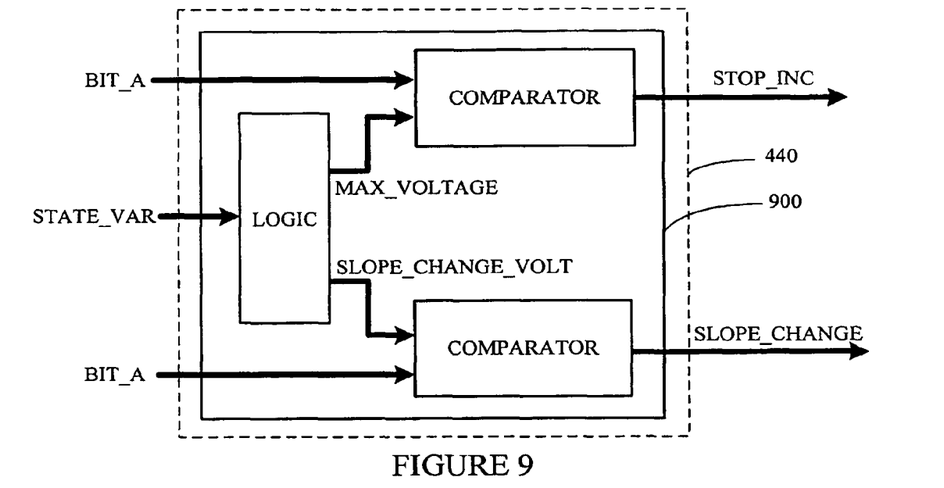
FIG. 9 illustrates a block diagram of circuitry of a ramp conditioning circuit of FIG. 4.

To control the end ramp condition, i.e., if in a particular state, a maximum voltage exists, the state variables in ramp_conditioning 440 set the stop_inc signal that stops clk_counter generation. Even in this case, the algorithm can continue to set single_step or ramp, but counter 400 will preserve the same digital values on bit_a. This can be used to obtain a flat portion in a ramp. A block diagram of logic circuitry 900 forming the ramp_conditioning 440 to generate the signals stop_inc and slope_change is shown in FIG. 9. Both of these signals are obtained as a result of a comparison between the current value of the bit_a bus and a reference value configured by some state variables.

All modifications in the flash memory without intermediate verifies can be managed solely by BLOCK A 300 of FLEX_BGEN 210 and with the switch_to_ver signal (coming from the microcontroller 200) at logic_value "0". If, as in multilevel programming, a verify occurs between two single modify pulses, BLOCK B 310 and BLOCK C 320 are needed as well to complete the functionality of FLEX_BGEN 210. In this case, after each pulse, the microcontroller 200 sets the switch_to_ver signal, and the verify value will then be provided to converter circuitry 220. The verify value used will depend on state variables (program, erase, etc.). While a verify is executed, the next pulse value can be prepared in BLOCK A 300. This value is not active in this phase as switch_to_ver is reset by microcontroller.

A simplified approach in managing pulse/verify/pulse switching is achieved in contrast with that described for the prior art. The simplified approach comprises:
1. Load first value into the counter.
2. Provide a programming pulse.
3. Switch SWITCH_TO_VER high.
4. Execute a verify sequence (in the middle time prepare by a single instruction for the next appropriate step, i.e., the next pulse configuration).
5. Switch SWITCH_TO_VER low.
6. Provide a pulse at the higher voltage set.

Only steps 3 to 6 have to be repeated multiple times. As compared to the prior art, four steps are saved (except, however, if step 9 of the prior art is executed in a single microinstruction, no increment or a single increment has to be performed. It requires two periods of microclock if the step is double).

In a multilevel operation, if M is the number of pulse/verify/pulse sequences, the clk_micro period if Tclk_micro, and Nstep_saved is the number of microinstructions saved in the new approach, the equation follows:

$$T\text{saved} = N\text{step\_saved} * T\text{clk\_micro} * M$$

Typical numbers of multilevel programming are: M=70 and Tclk_micro=100 ns (nanoseconds). If, for example, in a particular bit sequence, Nstep_saved is 4, Tsaved equals 28 usec. Considering that a typical word programming time indicated in multilevel flash datasheet is 150 usec, Tsaved represents about a 20% savings, which represents a significant result.

Although the present invention has been described in accordance with the embodiments shown, one of ordinary skill in the art will readily recognize that there could be variations to the embodiments and those variations would be within the spirit and scope of the present invention. For example, although particular logic circuitry components are illustrated in the figures for a preferred embodiment, other variations may exist to produce the functionality shown and described, as is well appreciated by those skilled in the art. Accordingly, many modifications may be made by one of ordinary skill in the art without departing from the spirit and scope of the appended claims.

What is claimed is:

1. A program pulse generation apparatus, comprising:
a flexible bit sequence generator responsive to received state variables and operable to generate a bit sequence that drives a converter for providing a multi-value voltage, the flexible bit sequence generator including:
a configurable voltage sequence generation unit responsive to the received state variables and operable to generate a first digital output that provides a programming pulse for the converter;
a voltage verification unit configured to generate a second digital output; and
a switch unit configured to select one of the first digital output and the second digital output based upon an input received from a micro controller; and
the converter configured to receive the selected one of the first digital output and the second digital output and to provide a multi-value voltage based upon the selected one of the first digital output and the second digital output.

2. The program pulse generation apparatus of claim 1, comprising an up/down counter coupled to the configurable voltage sequence generation unit.

3. The program pulse generation apparatus of claim 2, wherein the configurable voltage sequence generation unit comprises a first unit responsive to the state variables and a slope change signal to generate a carry-in signal that is transferred to the up/down counter.

4. The program pulse generation apparatus of claim 2, wherein the configurable voltage sequence generation unit comprises a second unit responsive to the state variables to generate a starting value for the multi-value voltage that is transferred to the up/down counter.

5. The program pulse generation apparatus of claim 2, wherein the configurable voltage sequence generation unit comprises a third unit responsive to the state variables to generate a slope change signal to alter a slope of the multi-value voltage, and a stop signal provided to the up/down counter.

6. The program pulse generation apparatus of claim 5, wherein the configurable voltage sequence generation unit comprises a fourth unit responsive to at least the stop signal generated by the third unit and operable to generate a load signal that sets a starting value for the up/down counter.

7. A program pulse generation apparatus, the apparatus comprising:
a configurable voltage sequence generation unit responsive to received state variables and operable to generate a first digital output, the configurable voltage sequence generation unit including:
an up/down counter configured to generate an increasing sequence for a multi-value voltage output;
a first unit responsive to the received state variables and a slope change signal to generate a carry-in signal that is input to the up/down counter;
a second unit responsive to the received state variables to generate a starting value for the multi-value voltage that is input to the up/down counter;

a third unit responsive to the state variables to generate a slope change signal to alter a slope of the multi-value voltage, and a stop signal provided to the up/down counter; and a fourth unit responsive to at least the stop signal generated by the third unit and operable to generate a load signal that sets a starting value for the up/down counter;

a voltage verification unit configured to generate a second digital output;

a switch unit configured to select one of the first digital output and the second digital output based upon an input received from a micro controller; and a converter configured to receive the selected one of the first digital output and the second digital output and to provide a multi-value voltage based upon the selected one of the first digital output and the second digital output.

* * * * *